(12) United States Patent
Burghartz

(10) Patent No.: US 6,452,413 B1
(45) Date of Patent: *Sep. 17, 2002

(54) SIGNAL SENSOR FOR RF INTEGRATED SYSTEMS

(75) Inventor: Joachim Norbert Burghartz, Shrub Oak, NY (US)

(73) Assignee: IBM Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/712,323

(22) Filed: Nov. 14, 2000

Related U.S. Application Data

(62) Division of application No. 08/923,049, filed on Sep. 3, 1997, now Pat. No. 6,177,806.

(51) Int. Cl.$^7$ .............................................. G01R 31/26
(52) U.S. Cl. ........................ 324/765; 324/117 H; 324/127
(58) Field of Search .................... 324/117 R, 117 H, 324/251, 252, 127, 95, 537, 765; 336/200, 232, 223

(56) References Cited

U.S. PATENT DOCUMENTS

| | | | |
|---|---|---|---|
| 4,724,381 A | 2/1988 | Crimmins | 324/127 |
| 4,810,989 A | 3/1989 | Brandenberg et al. | 324/127 |
| 4,823,075 A | 4/1989 | Alley | 324/117 H |
| 4,926,116 A | 5/1990 | Talisa | 324/117 R |
| 4,939,448 A | 7/1990 | Gudel | 324/127 R |
| 4,947,108 A | 8/1990 | Gudel | 324/117 R |
| 4,977,366 A | 12/1990 | Powell | 324/95 |
| 5,041,791 A | 8/1991 | Ackerman et al. | 324/318 |
| 5,057,848 A | 10/1991 | Rankin et al. | 343/703 |
| 5,059,902 A | 10/1991 | Linder | 324/207.17 |
| 5,204,613 A | 4/1993 | Cripps et al. | 324/95 |
| 5,420,464 A | 5/1995 | Krett | 307/98 |
| 5,451,865 A | 9/1995 | Coburn | 324/127 |
| 5,461,308 A | 10/1995 | Jin et al. | 324/117 |
| 5,467,013 A | 11/1995 | Williams et al. | 324/127 |
| 5,525,941 A | 6/1996 | Roshen et al. | 333/112 |
| 5,587,651 A | 12/1996 | Berkcan et al. | 324/127 |
| 5,598,135 A | 1/1997 | Maeda et al. | 336/200 |
| 5,761,791 A | 6/1998 | Bando | 29/609 |
| 5,831,426 A | 11/1998 | Black, Jr. et al. | 324/127 |
| 5,884,990 A | 3/1999 | Burghartz et al. | 336/200 |
| 5,894,224 A | * 4/1999 | De Jong | 324/537 |
| 5,963,038 A | * 10/1999 | De Jong et al. | 324/537 |
| 6,177,806 B1 | * 1/2001 | Burghartz | 324/765 |

\* cited by examiner

*Primary Examiner*—Michael J. Sherry
*Assistant Examiner*—Minh N. Tang

(57) ABSTRACT

A signal sensor is provided that includes a substrate, an input port formed on the substrate as a substantially linear conductive element, and a sensing port formed on the substrate adjacent to the input port. The sensing port is influenced by magnetic flux emanating from the input port such that a sense signal is generated in the sensing port. The sensing port can have as little as one sensing loop disposed on one side of the input port, but preferably includes at least one sensing loop on each side of the input port. The sensing loops on each side of the input port have an opposite sense of turn so that the sense signals in each loop are additive. A cross-over connector provides an electrical connection between the loops of the sensing port on opposite sides of the input port. The cross-over connector can be an underpass crossing below the input port or an overpass crossing above the input port. If desired, multiple sensing loops can be formed on each side of the input port. These sensing loops may be formed at the same fabrication level or may be formed on multiple fabrication levels. In the latter case, multi-level interconnects provide electrical connections between the sensing loops on each level.

13 Claims, 6 Drawing Sheets

SIGNAL SENSOR FOR RF INTEGRATED SYSTEMS

This application is a divisional of application number 08/923,049, filed Sep. 3, 1997, now U.S. Pat. No. 6,177,806.

BACKGROUND OF THE INVENTION

The present invention is directed generally to signal sensing devices for sensing signal parameters such as current and power. More particularly, the present invention relates to the construction and use of such devices for sensing signals in radio frequency ("rf") systems which are fabricated on substrates using integrated circuit fabrication techniques. Still more particularly, the present invention concerns a signal sensor structure which is fabricated as part of an rf integrated system. In a further aspect, the present invention involves an rf power sensor for sensing power in rf circuits without ohmic losses or high inductive impedances, while providing a sense signal that is only 10–20 dB smaller than the rf signal to be sensed with negligible phase change.

Monolithic rf devices such as transceivers, amplifiers and the like formed on substrates such as silicon are of interest because they have the potential to be fabricated at low cost in large volumes, and can be designed for low power consumption, i.e. portable applications. Power detection is essential in those systems in order to adjust the power to the minimum required levels. Power sensing as part of feedback loops can help to improve the linearity of building blocks because biasing conditions can be adjusted to eliminate nonlinear signal components. The number of required devices, such as filters and the like, can thus be reduced. As a result of the reduced device count, noise is minimized such that lower power levels may be used.

The simplest known power sensor, a series resistor, is lossy and provides a sense signal with the same potential as that of the power port. A potential-independent sense signal can be provided with a transformer structure, but that device has a power port with a relatively high inductance and considerable losses. As a result, the power level has to be adjusted to compensate for those losses, and the power port of the sensor has to be considered as part of the matching network between building blocks, which complicates the design. Those concerns are most important for power amplifiers in rf transceivers wherein a power sensor is attached to the output port. Any additional loss associated with the insertion of the power sensor will reduce the power-added-efficiency of the amplifier. This has a direct impact on the power consumption of the transceiver because a major part of the power applies to the power amplifier.

In U.S. Pat. No. 5,041,791 to Ackerman et al., a magnetic resonance RF antenna probe is described that consists of a transmitter coil for transmitting rf energy to a specimen. A receiver coil comprising two anti-phase receiver elements senses the rf energy absorbed or emitted by the specimen. In order to eliminate unwanted coupling between the transmitter and receiver coils, this design calls for rotation of one of the receiver coil elements in order to balance the current induced by the transmitter coil in both receiver elements to zero. Thus, the disclosed device could not be readily fabricated on a substrate using integrated circuit fabrication techniques. U.S. Pat. No. 4,977,366 to Powell and U.S. Pat. No. 4,724,381 to Crimmins disclose sensors for transmission lines that produce a sense signal with a potential that is undesirably dependent on that of the power port. The same restriction applies to the proposal of U.S. Pat. No. 5,420,464 to Krett, where voltage drop across a resistor is used to sense power levels. U.S. Pat. No. 5,461,308 to Jin et al. discloses a power sensing device that takes advantage of the fact that a magnetic field affects the resistance of magneto-resistive material. U.S. Pat. No. 5,057,848 to Rankin et al. discloses orthogonal antenna pairs to sense electromagnetic energy.

The prior art thus lacks important features that are necessary to a signal sensor design with improved efficiency and which can be readily used with monolithic devices fabricated on substrates using integrated circuit techniques. What is needed is a signal sensor having an input port that is configured for minimum loss and impedance, but which provides a sense signal that is only one or two orders of magnitude (i.e.,10–20 dB) less than the input signal, and which has a negligible change in phase. What is especially required is a power sensor that can be fabricated in silicon or the like and used in rf integrated systems.

SUMMARY OF THE INVENTION

It is a primary object of the present invention to provide a sensor for sensing signals without resistive losses or high inductive impedances.

It is a further object of the present invention to provide a sensor for sensing signals that does not need to operate at the same potential as the input port.

It is a further object of the present invention to provide a sensor for sensing signals in which the sense signal is not more than about 10–20 dB less than the input signal.

It is a further object of the present invention to fulfill the foregoing objectives using a sensor device that is fabricated using integrated circuit techniques, either as a discrete device or as part of an integrated system.

In accordance with the foregoing objectives, a signal sensor is provided that includes a substrate, an input port formed on the substrate as a substantially linear conductive element, and a sensing port formed on the substrate adjacent to the input port. The sensing port is influenced by magnetic flux emanating from the input port such that a sense signal is generated. The sensing port can have as little as one sensing loop disposed on one side of the input port, but preferably includes at least one sensing loop on each side of the input port. The sensing loops on each side of the input port have an opposite sense of turn so that the sense signals in each loop are additive. A cross-over connector provides an electrical connection between the loops of the sensing port on opposite sides of the input port. The cross-over connector can be an underpass crossing below the input port or an overpass crossing above the input port. If desired, multiple sensing loops can be formed on each side of the input port. These sensing loops may be formed at the same fabrication level or may be formed on multiple fabrication levels. In the latter case, multilevel interconnects provide electrical connections between the sensing loops on each level.

BRIEF DESCRIPTION OF THE DRAWING

The objects, advantages and features of the present invention will be more clearly understood by reference to the following detailed disclosure and the accompanying drawing in which.

DETAILED DESCRIPTION OF THE PREFERRED EMBODIMENTS

Figure 1:
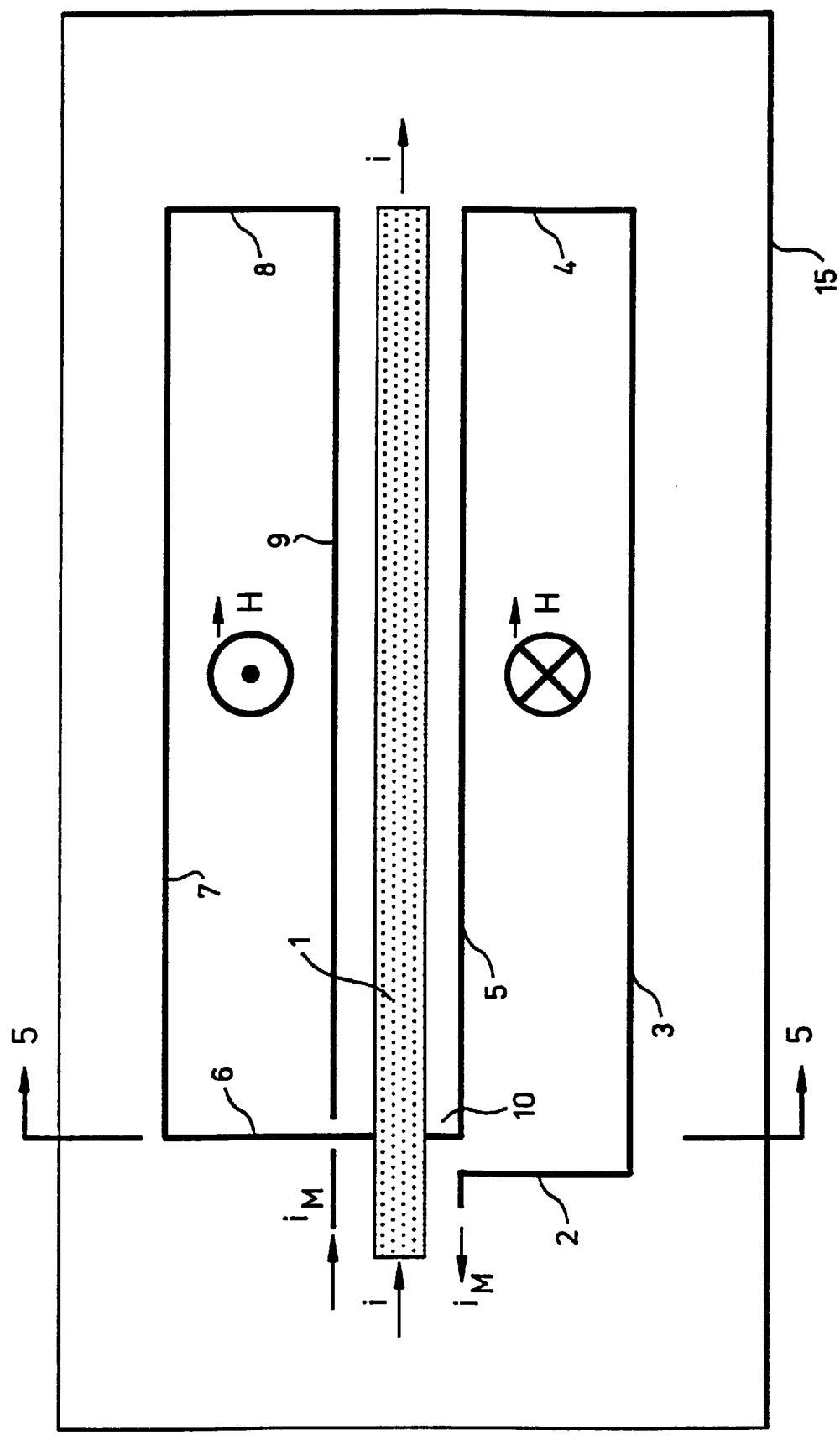
FIG. 1 is a plan view of a signal sensor constructed in accordance with one aspect of the present invention.

Referring now to FIG. 1, one possible embodiment of a signal sensor constructed in accordance with the present invention is shown in which the signal sensor is designed as a power sensor for an rf circuit (not shown), such as an rf transceiver or power amplifier. The rf current to be sensed (labeled "i" in FIG. 1) is received from the rf circuit. The current i is driven through a substantially straight conductive element, such as the wire 1, to a load (not shown) which may be an antenna, another circuit component, or any other device. The wire 1 also provides an input port to the signal sensor. A magnetic field H that has a radial symmetry with respect to the input wire 1, is generated by the rf current i.

A sensing port is disposed adjacent to the input wire 1 within the magnetic field H so that a sense current $i_M$ is generated. The sensing port includes a first sensing coil formed by a first sensing loop placed on the one side of the wire 1. The first sensing loop consists of the sensing wire segments 2, 3, 4 and 5 and has a first selected direction of turn that could be clockwise or counterclockwise depending on the desired direction of the sense current $i_M$. The sensing port further includes a second sensing coil formed by a second sensing loop placed on the opposite side of the wire 1. The second sensing loop consists of the sensing wire segments 6, 7, 8 and 9 and has an opposite sense of turn from the first sensing loop. A cross-over connection in the form of an underpass contact 10 is used to electrically connect the two sensing loops in series.

The sense of turn of the first sensing loop has to be opposite to the sense of turn of the second sensing loop so that the sense currents $i_M$ induced by the field H are additive. The spacing of the sensing wire segments 5 and 9 from the input wire 1 must be small enough to detect a sufficiently high sense signal, but the spacing must also be large enough to minimize parasitic capacitances. It will be appreciated that the optimum distance will vary from device to device and should therefore be determined by empirical analysis if peak efficiency is desired. The sense signal $i_M$ can be increased by making the length of the sensing wire segments 2, 4, 6, and 8 larger, but this design aspect is limited because the field H decays hyperbolically with distance from the input wire 1. A more effective way to increase the sense signal $i_M$ is to make the length of the sensing wire segments 3, 5, 7, and 9 large if that is possible within the circuit layout. This results in the rectangular coil shape shown in FIG. 1. A variation of the foregoing dimensions will lead to a well-predictable linear change of the sense signal $i_M$.

The sensor of FIG. 1 can be easily constructed using conventional integrated circuit fabrication techniques. Thus, as shown additionally in FIG. 5, the input wire 1 and the sensing wire segments 2–9 are formed out of conductive material (made from aluminum or the like) that is deposited or otherwise formed on a substrate 15 made from silicon or the like. Conventional photo resist masking techniques can be used to etch the conductive material to define the shapes of the components. Adjacent dielectric layers are applied to electrically insulate the conductive material from other conductive layers.

Figure 5:
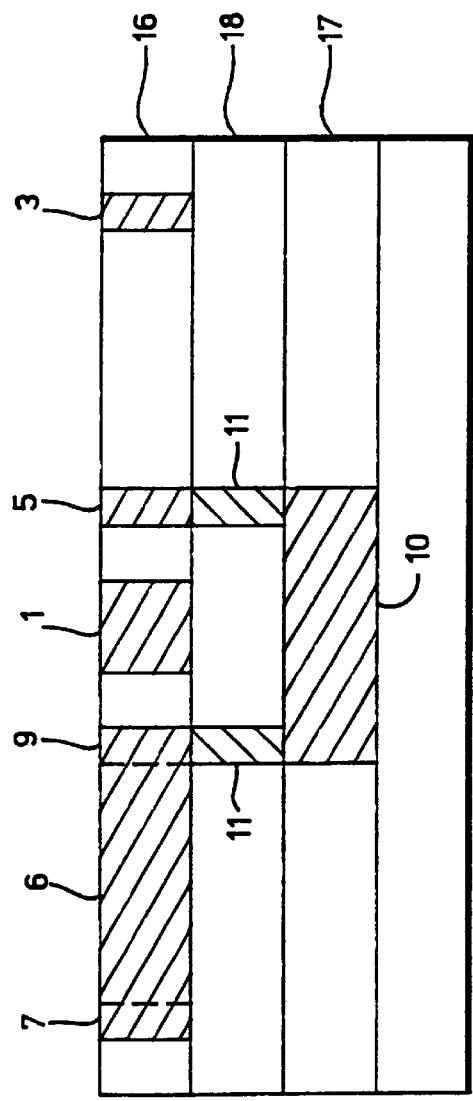
FIG. 5 is a cross-sectional view taken along line 5—5 in FIG. 1 showing details of the multi-level construction of the signal sensor of FIG. 1.

The input wire 1 and the sensing wire segments 2–9 can be formed at the same or different fabrication levels or layers. In the structure of FIGS. 1 and 5, wherein the sensing port consists of sensing coils having a single sensing loop on each side of the input port formed by the input wire 1, the preferred configuration is to build the components at the same metal level, preferably at the top level of the device (shown by reference numeral 16 in FIG. 5) which typically has the greatest metal thickness and thus the lowest resistivity. The underpass contact 10 must be built at a metal level different (e.g., lower) than the level containing the input wire 1 to establish dc isolation between the power port, i.e. the input wire 1, and the sensing port, i.e. the sensing wire segments 2–9. As shown in FIG. 5, the underpass contact 10 is built on a metal layer 17 located below the metal layer 16.

The minimum number of metal levels required for the sensor structure of FIG. 1 is thus two. The metal layers 16 and 17 are separated from each other by a dielectric layer 18, as can be seen in FIG. 5, that electrically isolates the metal layers. As is known, in order to provide an electrical connection between adjacent conductive layers separated by a dielectric layer, a multilevel interconnect or via can be used. Such multilevel interconnects are a standard feature of many silicon fabrication processes.

In the sensor of FIGS. 1 and 5, the sensor wire segments 5 and 6 are joined to the underpass 10 using vias 11, such that the underpass 10 electrically connects the sensing wire segments 5 and 6. Note that instead of using an underpass contact 10, an overpass contact could be used if the input wire 1 and sensing wire segments 2–9 were formed at a lower level of the device.

The sense current $i_M$ flows in a single direction between the sensing wire segment 2 of the first sensing coil and the sensing wire segment 9 of the second sensing coil. These segments of the sensing port may be connected to monitoring equipment to measure the power of the rf signal passing through the input port, or more preferably, the sense signal $i_M$ developed in the sensing port is fed back to a device whose rf output is connected to the input port of the power sensor as part of a power monitoring or feedback loop. In the configuration shown in FIG. 1, the sense current $i_M$ flows from the sensing wire segment 9, which thus defines a sensing coil input, to the sensing wire segment 2, which thus defines a sensing coil output. To reverse the direction of current flow, the sense of turn of the first and second coils would be reversed from the direction shown in FIG. 1. Note that the segment 9 of the second sensing coil must be connected through vias (not shown) to an underpass (not shown) in order to route the sense current $i_M$ around the sensing wire segment 6.

Figure 2:
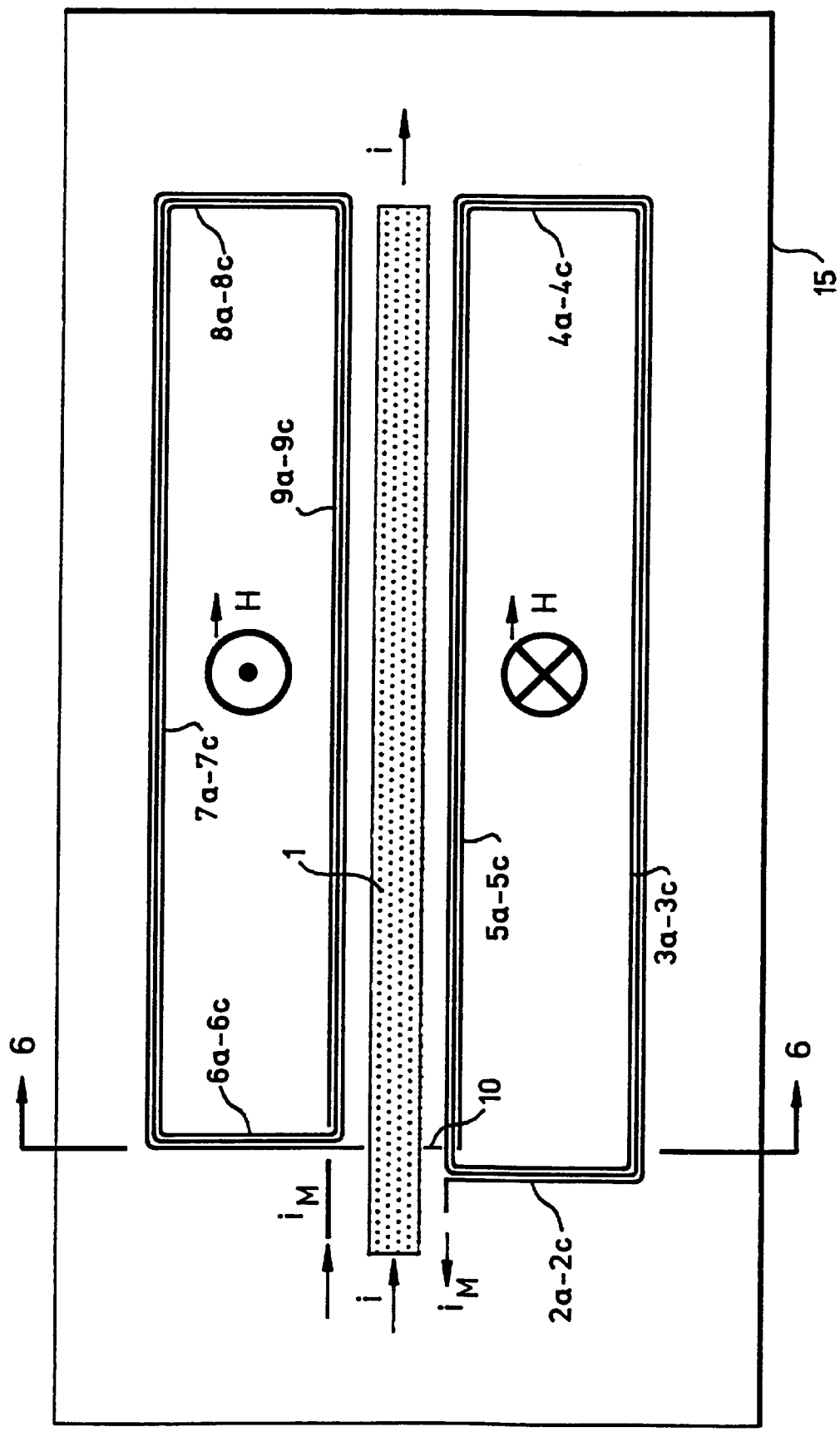
FIG. 2 is a plan view of a signal sensor constructed in accordance with another aspect of the present invention.

Turning now to FIG. 2, the magnitude of the sense signal $i_M$ can be further increased by using the power sensor structure shown therein, which is also built using integrated circuit fabrication techniques on the substrate 15. In this structure, the single-loop sensing coils shown in FIG. 1 are replaced by sensing coils having three sensing loops each. A first sensing coil on one side of the input wire 1 has a first sensing loop formed by sensing wire segments 2a, 3a, 4a and 5a, a second sensing loop formed by sensing wire segments 2b, 3b, 4b and 5b, and a third sensing loop formed by sensing wire segments 2c, 3c, 4c and 5c. As shown additionally in FIG. 6, the sensing loops of the first sensing coil are built at the same metal level, which is preferably at the same level as the input wire 1. The sensing loop consisting of the sensing wire segments 2a, 3a, 4a, and 5a forms the outermost loop of the first sensing coil. The sensing loop consisting of the sensing wire segments 2c, 3c, 4c, and 5c is the innermost loop of the first sensing coil.

Figure 6:
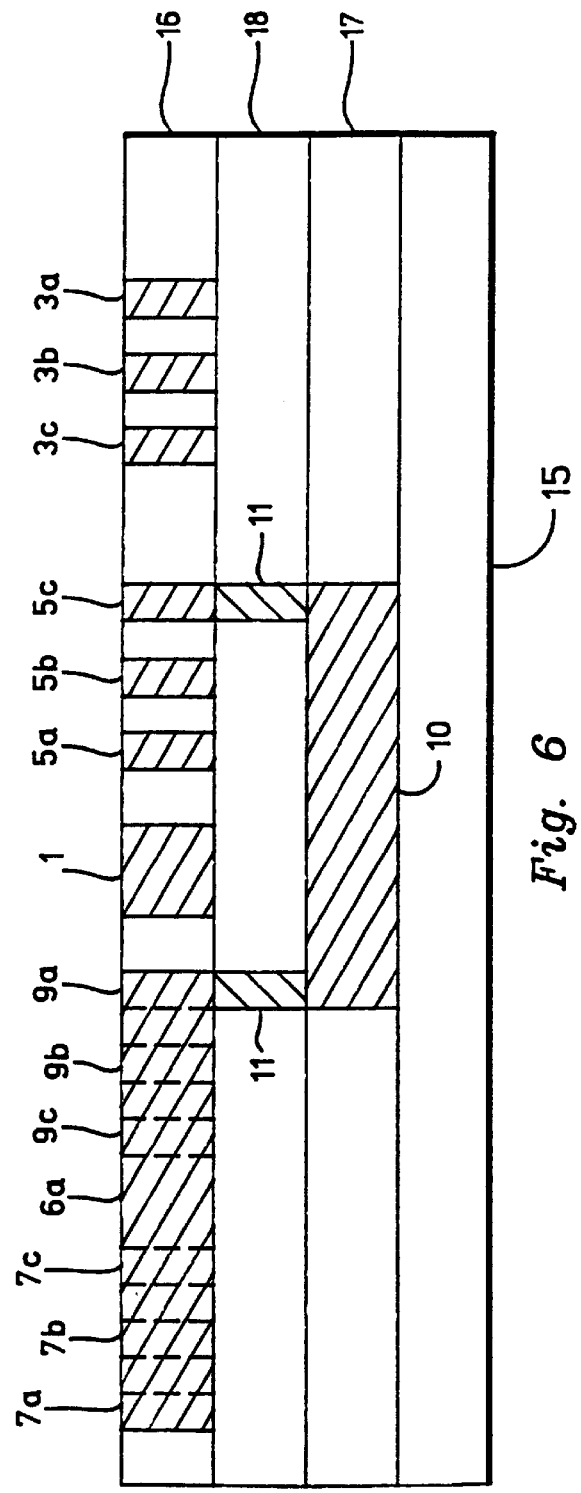
FIG. 6 is a cross-sectional view taken along line 6—6 in FIG. 2 showing details of the multi-level construction of the signal sensor of FIG. 2.

The same configuration is used for the second sensing coil placed on the other side of the input wire 1, but the sense of turn has to be opposite to that of the first coil. The second sensing coil has a first sensing loop formed by sensing wire segments 6a, 7a, 8a and 9a, a second sensing loop formed by sensing wire segments 6b, 7b, 8b and 9b, and a third sensing loop formed by sensing wire segments 6c, 7c, 8c and 9c. The sensing loops of the second sensing coil are built at the same metal level, preferably at the same level as the input wire 1. The sensing loop consisting of the sensing wire segments 6a, 7a, 8a, and 9a forms the outermost loop of the second sensing coil. The sensing loop consisting of the sensing wire segments 6c, 7c, 8c, and 9c is the innermost loop of the first sensing coil. The foregoing sensing loops, together with the wire 1, are all formed on a single metal layer 16 of the device, as shown in FIG. 6. The underpass contact (10), that connects the two triple-loop sensing coils in series, is built on a lower metal layer 17 that is separated from the metal layer 16 by a dielectric layer 18. Thus, for this sensor configuration, the minimum number of metal levels is two and the number of dielectric layers is one. Note that instead of using an underpass contact 10, an overpass contact could be used if the input wire 1 and sensing wire segments 2a–9c were formed at a lower level of the device.

The underpass 10 is electrically connected to the sensing wire segments 5c and 6a through vias 11. The sense current $i_M$ runs in a single direction between the sensing wire segment 2a of the first sensing coil and the sensing wire segment 9c of the second sensing coil. These segments of the sensing port may be connected to monitoring equipment to measure the power of the rf signal passing through the input port, or more preferably, the sense signal developed in the sensing port is fed back to a device whose rf output is connected to the input port as part of a power monitoring or feedback loop.

In the configuration shown in FIG. 2, the sense current $i_M$ flows from the sensing wire segment 9c, which thus defines a sensing coil input, to the sensing wire segment 2a, which thus defines a sensing coil output. To reverse the direction of current flow, the sense of turn of the first and second coils would be reversed from the direction shown in FIG. 2. Note that the segment 9c of the second sensing coil must be connected through vias (not shown) to an underpass (not shown) in order to route the sense current $i_M$ around the sensing wire segments 6a, 6b and 6c.

Figure 3:
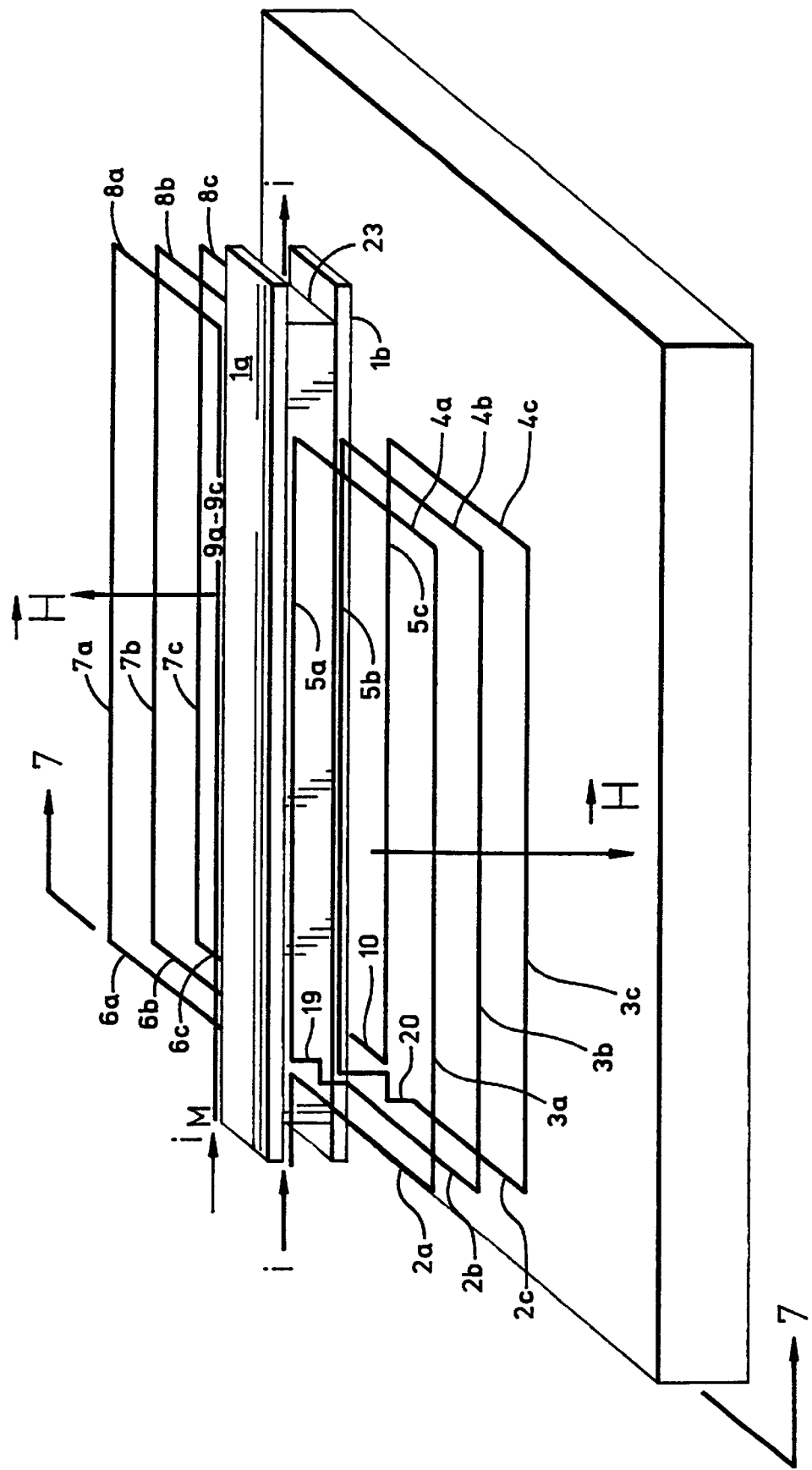
FIG. 3 is a perspective view of a signal sensor constructed in accordance with still another aspect of the present invention.
Figure 7:
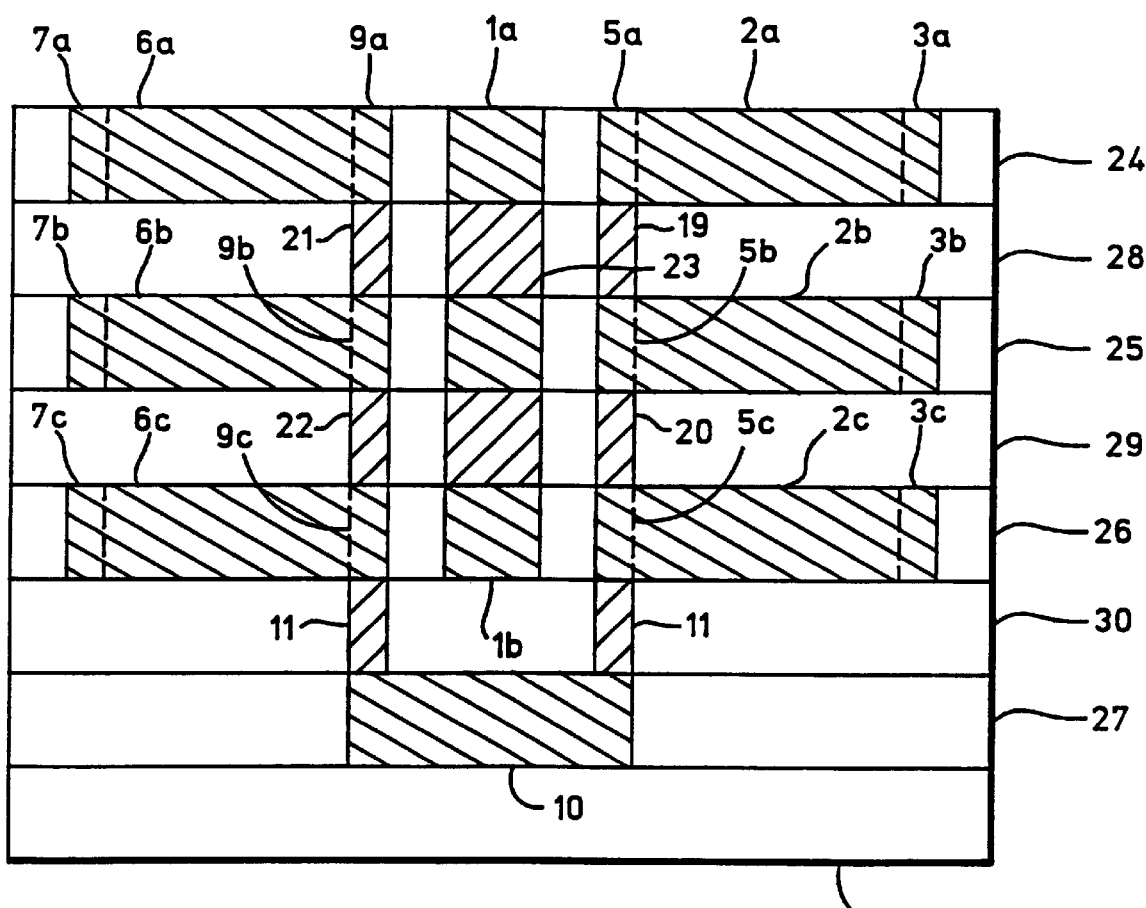
FIG. 7 is a cross-sectional view taken along line 7—7 in FIG. 3 showing details of the multi-level construction of the signal sensor of FIG. 3.

Turning now to FIG. 3, another alternative sensor structure is constructed using integrated circuit fabrication techniques on the substrate 15. This structure has three sensing loops in each of the sensing coils, but the sensing loops of each coil are stacked at three different metal levels of the device instead of being formed at the same metal level, as shown in FIG. 7. The first sensing loop in the first sensing coil consists of the sensing wire segments 2a, 3a, 4a and 5a. A via 19 is formed during the integrated circuit fabrication process to provide a connection to the second sensing loop located beneath the first sensing loop. The second sensing loop consists of sensing wire segments 2b, 3b, 4b and 5b. The via 19 connects the sensing wire segment 5a of the first sensing loop to the sensing wire segment 2b of the second sensing loop. A via 20, which is also formed during the integrated circuit fabrication process, connects the second sensing loop to the third and lowest sensing loop. The third sensing loop consists of the sensing wire segments 2c, 3c, 4c and 5c. The via 20 connects the sensing wire segment 5b of the second sensing loop to the sensing wire segment 2c of the third sensing loop.

A second sensing coil built on the other side of the input wire 1 has the same configuration as the first sensing coil but an opposite sense of turn. The first sensing loop in the second sensing coil consists of the sensing wire segments 6a, 7a, 8a and 9a. A via 21 is formed during the integrated circuit fabrication process to provide a connection to the second sensing loop located beneath the first sensing loop. The second sensing loop consists of sensing wire segments 6b, 7b, 8b and 9b. The via 21 connects the sensing wire segment 6a of the first sensing loop to the sensing wire segment 9b of the second sensing loop. A via 22, which is also formed during the integrated circuit fabrication process, connects the second sensing loop to the third and lowest sensing loop. The third sensing loop consists of the sensing wire segments 6c, 7c, 8c and 9c. The via 22 connects the sensing wire segment 6b of the second sensing loop to the sensing wire segment 9c of the third sensing loop.

In the structure shown in FIG. 3, the power port formed by the wire 1 has two metal layers 1a and 1b shunted by a via 23 to reduce ohmic losses. The metal layer 1a is preferably formed at the same level as the sensing wire segments 2a–9a, while the metal layer 1b is preferably formed at the same level as the sensing wire segments 2c–9c. The triple-loop sensing coils on each side of the power port are connected in series by the underpass 10, which is electrically connected through vias 11 to the sensing wire segments 5c and 6c below the level of the metal layer 1b. Thus, for the configuration of FIG. 3, there would typically be a minimum of four conductive layers (shown in FIG. 7 by reference numerals 24, 25, 26 and 27) and three dielectric layers (shown in FIG. 7 by reference numerals 28, 29 and 30) separating the conductive layers. Note that instead of using an underpass contact 10, an overpass contact could be used if the input wire 1 and sensing wire segments 2a–9c were formed at a lower level of the device.

The sense current $i_M$ runs in a single direction between the sensing wire segment 2a of the first sensing coil and the sensing wire segment 9a of the second sensing coil. These segments of the sensing port may be connected to monitoring equipment to measure the power and/or current of the rf signal passing through the input port, or more preferably, the sense signal developed in the sensing port is fed back to a device whose output is connected to the input port as part of a power monitoring or feedback loop.

In the configuration shown in FIG. 3, the sense current $i_M$ flows from the sensing wire segment 9a, which thus defines a sensing coil input, to the sensing wire segment 2a, which thus defines a sensing coil output. To reverse the direction of current flow, the sense of turn of the first and second coils would be reversed from the direction shown in FIG. 3. Note that the segment 9a of the second sensing coil must be connected through vias (not shown) to an underpass (not shown) in order to route the sense current $i_M$ around the sensing wire segment 6a.

Figure 4:
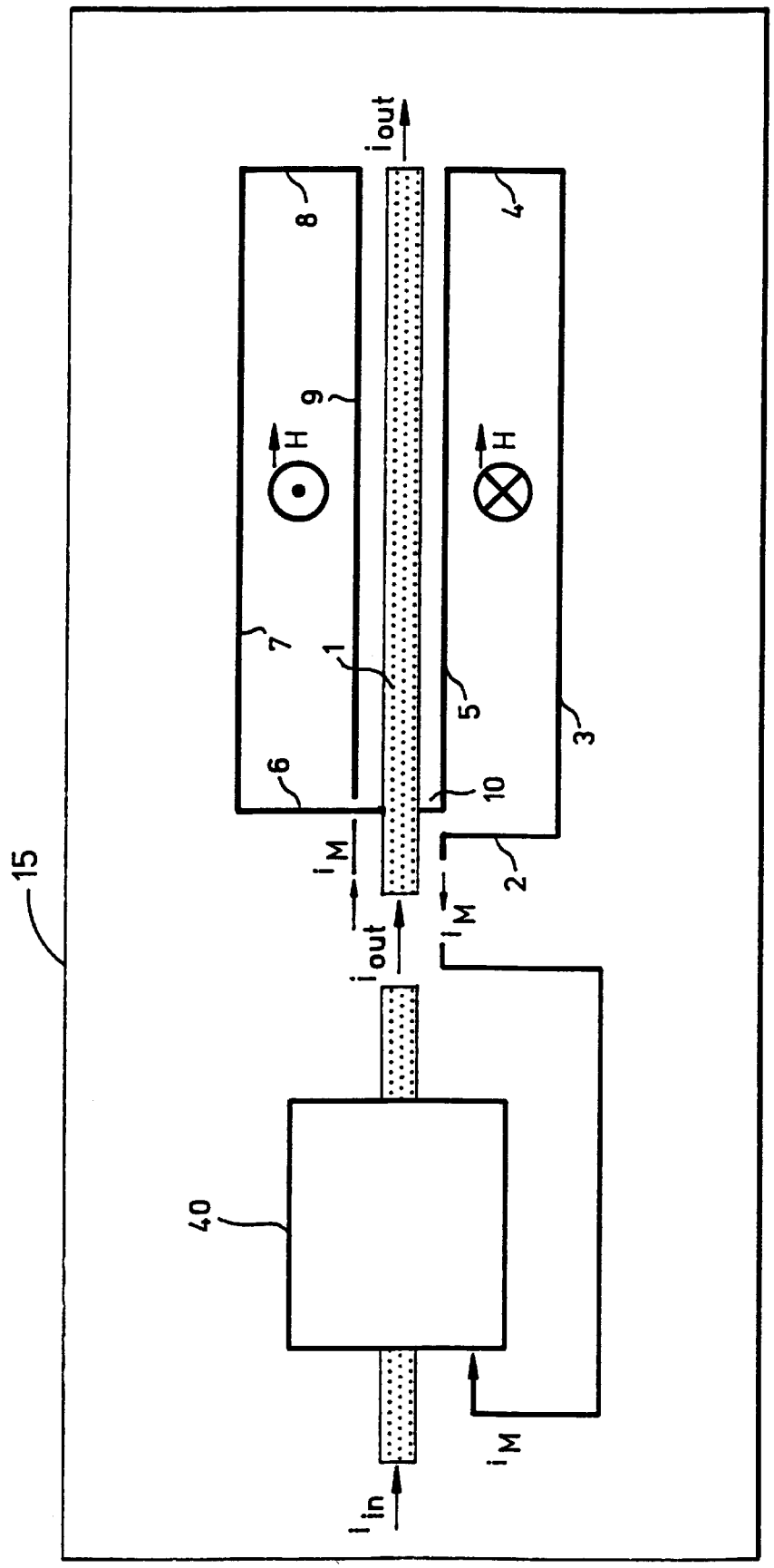
FIG. 4 is a plan view of an rf system with an integrated signal sensor constructed in accordance with still another aspect of the present invention.

Turning now to FIG. 4, another alternative construction in accordance with the invention is shown in which the power sensor structure of FIG. 1 and an rf device 40 are both fabricated as part of an integrated rf system with power sensing capability. The power sensor and the rf device are constructed using integrated circuit fabrication techniques on the common substrate 15. The rf device 40 could be an rf transceiver or a component such as a power amplifier. The sensing port is connected for operation as part of a power sensing or feedback loop that controls the output of the rf device 40. During operation, the input side of the rf device 40 receives an input signal $i_{in}$, and the output side of the rf device produces an output signal $i_{OUT}$. The $i_{OUT}$ signal is routed along the wire 1 to the input port of the power sensor, and thence to an output pin (not shown) of the integrated system. The sensing port of the power sensor generates a sense signal $i_M$ which is fed back to the input side of the rf device 20, such that the output $i_{OUT}$ can be adjusted accordingly.

The sensors described above in the foregoing embodiments of the present invention provide an electromagnetic field sensor capable of detecting rf signals over an operating range of at least 1 to 10 GHz. The input ports of these sensors consist of a substantially straight wire through which an rf power signal can be driven with minimal ohmic losses and parasitic inductance and capacitance. The metal sensing coils positioned on one or both sides of the input port and laterally close thereto are influenced by the magnetic flux generated by the rf input signal, such that a well defined sense signal is induced. Because the sensor is preferably built using integrated circuit fabrication techniques, which includes the use of multilevel interconnects, the sensing coils can be easily fabricated with one or more loops at one metal level only, or with several loops extending over several metal layers.

There are a number of significant differences between the sensor structures of the present invention and the sensors of the prior art. One difference is that the present sensor utilizes a substantially straight wire at the power input port instead of a wire coil, and does not need to operate at the same potential as the input signal. Another difference is that the present sensor can be fabricated as an integrated sensor device rather than a sensor which consists of two discrete coils. The sensor can thus be incorporated into an integrated rf system designed for low power consumption and hence portable applications. Relatedly, by building the sensing coils using the metal interconnects available with any silicon fabrication process, the coils can be made so as to have a relatively flat rectangular shape in which the vertical height of the coils (i.e., in a direction normal to the substrate) is small relative to the length and width of the coils.

Accordingly, a signal sensor for rf integrated systems has been described. While various embodiments have been disclosed, it should be apparent that many variations and alternative embodiments can be constructed in view of the teachings herein. For example, the features of the above-described sensor structures can be combined in many ways as long as the basic function of the sensor is not disturbed. It should also be apparent that the basic sensor concept disclosed above can apply to areas other than integrated circuit technology and multilevel interconnects. It is understood, therefore, that the invention is not to be in any way limited except in accordance with the spirit of the appended claims and their equivalents.

I claim:

1. A signal sensor adapted for minimum signal loss and impedance while producing a sense signal of maximum strength and negligible phase change, comprising;

a substrate;

plural fabrication levels formed over said substrate;

an input port formed in one of said fabrication levels as a substantially straight conductive element;

a sensing port adjacent to said input port, said sensing port having first multiple sensing loops formed on a first side of said input port; and wherein said first multiple sensing loops are formed in a single one of said fabrication levels.

2. A signal sensor adapted for minimum signal loss and impedance while producing a sense signal of maximum strength and negligible phase change, comprising;

a substrate;

plural fabrication levels formed over said substrate;

an input port formed in one of said fabrication levels as a substantially straight conductive element;

a sensing port adjacent to said input port, said sensing port having first multiple sensing loops disposed on a first side of said input port, and second multiple sensing loops disposed on a second side of said input port;

said sensing port further including a cross-over connection electrically joining said first and second multiple sensing loops. said cross-over connection being formed over said substrate in a fabrication level which is different from the fabrication level of said input port; and wherein said first and second multiple sensing loops are formed in a single one of said fabrication levels.

3. A power sensor for an rf integrated system, comprising:

a substrate;

a first conductive layer formed over said substrate;

a cross-over connector defined in said first conductive layer;

a first dielectric layer formed over said first conductive layer;

a second conductive layer formed over said first dielectric layer;

an input port defined in said second conductive layer as a substantially straight conductive element;

a pair of sensing coils defined in said second conductive layer as a plurality of sensing loops adjacently disposed on each side of said input port;

a first multi-level interconnect extending between said first and second conductive layers and electrically connecting a sensing loop of one of said sensing coils on one side of said input port to said cross-over connector;

a second multi-level interconnect extending between said first and second conductive layers and electrically connecting a sensing loop of the other one of said sensing coils on an opposite side of said input port to said cross-over connector;

said cross-over connector and said first and second multi-level interconnects providing a series connection between said sensing coils.

4. The signal sensor of claim 1, further including an rf device fabricated over said substrate.

5. The signal sensor of claim 4, wherein said sensing port further includes second multiple sensing loops formed in one of said fabrication levels, said second multiple sensing loops being disposed on a second side of said input port, said sensing port further including a cross-over connection electrically joining said first and second multiple sensing loops, said cross-over connection being formed over said substrate in a fabrication level which is different from the fabrication level of said input port.

6. The signal sensor of claim 4, wherein said sensing port further includes second multiple sensing loops disposed on a second side of said input port and wherein said first and second multiple sensing loops are formed in a single one of said fabrication levels.

7. The signal sensor of claim 4, wherein said first multiple sensing loops are generally rectangular in shape and have a pair of long sides and a pair of short sides, and wherein one of said long sides lies adjacent and parallel to said input port.

8. The signal sensor of claim 4, wherein said sensing port forms a power sensor.

9. The signal sensor of claim 4, wherein said input port carries an output signal said rf device and said sensing loop carries a sense signal that is fed back to said rf device to form a feedback loop.

10. The signal sensor of claim 4, wherein said sensing port is placed close enough to said input port to be influenced by a magnetic field generated thereby but not so close as to induce substantial capacitive coupling between said input port and said sensing port.

11. The signal sensor of claim 4, wherein said rf device is an rf transceiver.

12. The signal sensor of claim 4, wherein said rf device is an amplifier.

13. The signal sensor of claim 4, wherein said sensor generates a power sense signal sensing loop that is not more than substantially 20 dB less than the power of an signal provider at said input port.

\* \* \* \* \*